(12) United States Patent
Kirsch

(10) Patent No.: US 6,738,301 B2
(45) Date of Patent: May 18, 2004

(54) METHOD AND SYSTEM FOR ACCELERATING COUPLING OF DIGITAL SIGNALS

(75) Inventor: Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 10/232,421

(22) Filed: Aug. 29, 2002

(65) Prior Publication Data
US 2004/0042303 A1 Mar. 4, 2004

(51) Int. Cl.$^7$ ................................................ G11C 7/00
(52) U.S. Cl. .................. 365/203; 365/189.01; 365/204
(58) Field of Search ........................... 365/203, 189.05, 365/189.01, 230.06, 204

(56) References Cited

U.S. PATENT DOCUMENTS

| | | | |
|---|---|---|---|
| 4,266,238 A | 5/1981 | Nishizawa | 357/48 |
| 4,370,737 A | 1/1983 | Chan | 365/203 |
| 4,984,206 A | 1/1991 | Komatsu et al. | 365/208 |
| 5,222,038 A | 6/1993 | Tsuchida et al. | 365/204 |
| 5,287,312 A | 2/1994 | Okamura et al. | 365/201 |
| 5,487,043 A | 1/1996 | Furutani et al. | 365/203 |
| 5,506,808 A | 4/1996 | Yamada et al. | 365/208 |
| 5,646,885 A | 7/1997 | Matsuo et al. | 365/185.05 |
| 5,646,899 A | 7/1997 | Jang et al. | 365/205 |
| 5,903,503 A * | 5/1999 | Yamauchi et al. | 365/203 |
| 6,018,486 A | 1/2000 | Ferrant | 365/203 |
| 6,061,278 A | 5/2000 | Kato et al. | 365/190 |
| 6,081,443 A | 6/2000 | Morishita et al. | 365/149 |
| RE36,813 E | 8/2000 | Kajigaya | 365/51 |
| 6,157,581 A | 12/2000 | Higashi | 365/189.11 |
| 6,195,298 B1 | 2/2001 | Furutani et al. | 365/189.11 |
| 6,205,556 B1 | 3/2001 | Watanabe et al. | 713/330 |
| 6,215,706 B1 | 4/2001 | Harrand et al. | 365/189.05 |
| 6,219,290 B1 | 4/2001 | Chang et al. | 365/207 |
| 6,226,755 B1 | 5/2001 | Reeves | 713/400 |
| 6,233,188 B1 * | 5/2001 | Kai | 365/203 |
| 6,297,993 B1 | 10/2001 | Chen et al. | 365/185.33 |
| 6,324,110 B1 | 11/2001 | Leung et al. | 365/207 |
| 6,366,492 B1 | 4/2002 | Kawasumi | 365/154 |
| 6,373,763 B1 | 4/2002 | Taito et al. | 365/203 |
| 6,381,186 B1 | 4/2002 | Okamura et al. | 365/201 |
| 6,434,070 B1 | 8/2002 | Itou et al. | 365/203 |
| 6,480,435 B2 | 11/2002 | Nakamura et al. | 365/207 |
| 6,515,930 B2 | 2/2003 | Jacquet et al. | 365/222 |
| 6,525,969 B1 | 2/2003 | Kurihara et al. | 365/185.25 |
| 6,552,953 B2 | 4/2003 | Blodgett | 365/233 |
| 6,570,800 B2 | 5/2003 | Tanaka et al. | 365/219 |
| 6,590,824 B2 | 7/2003 | Benedix et al. | 365/222 |

OTHER PUBLICATIONS

Dobbelaere, Ivo et al., "Regenerative Feedback Repeaters for Programmable Interconnections,".
Kirihata, Toshiaki et al., "A 390mm$^2$ 16 Bank 1Gb DDR SDRAM with Hybrid Bitline Architecture," IEEE International Solid–State Circuits Conference, Session 24, Paper WP 24.7, Feb. 17, 1999, pp. 422–423.

(List continued on next page.)

Primary Examiner—Richard Elms
Assistant Examiner—Nam Nguyen
(74) Attorney, Agent, or Firm—Dorsey & Whitney, LLP

(57) ABSTRACT

A system and method for coupling read data signals and write data signals through I/O lines of a memory array. Precharge circuits precharge alternating signal lines to high and low precharge voltages. An accelerate high circuit coupled to each of the I/O lines that has been precharged low detects an increase in the voltage of the I/O line above the precharge low voltage. The accelerate high circuit then drives the I/O line toward a high voltage, such as $V_{CC}$. Similarly, an accelerate low circuit coupled to each of the I/O lines that has been precharged high detects a decrease in the voltage of the I/O line below the precharge high voltage. The accelerate low circuit then drives the I/O line to a low voltage, such as ground.

70 Claims, 9 Drawing Sheets

OTHER PUBLICATIONS

Kirihata, Toshiaki et al., "*A 220 mm$^2$ and 8 Bank 256 Mb SDRAM with Single–Sided Stitched WL Architecture*," IEEE International Solid–State Circuits Conference, Session 5, Paper TP 5.4, Feb. 5, 1998, pp. 78–79.

Wu, Chung–Yu et al., "*Delay Models and Speed Improvement Techniques for RC Tree Interconnections Among Small–Geometry CMOS Inverters*," IEEE Journal of Solid–State Circuits, vol. 25, No. 5, Oct. 1990, pp. 1247–1256.

* cited by examiner

METHOD AND SYSTEM FOR ACCELERATING COUPLING OF DIGITAL SIGNALS

TECHNICAL FIELD

This invention relates to digital systems, such as dynamic random access memories ("DRAMs"), and, more particularly to an accelerator system and method for more quickly coupling digital signals though capacitive signal lines.

BACKGROUND OF THE INVENTION

The speed at which digital signals can be coupled between two nodes of a signal line is a function of the capacitance and resistance of the signal line and the distance between the two nodes. Digital signals can be coupled through signal lines that have a high resistance and a high capacitance relatively slowly, and therefore may incur a significant signal propagation delay particularly if the propagation path is long.

These signal propagation delays can be particularly troublesome in memory devices. On the one hand, it is important for memory bandwidth that signals be coupled with as little propagation delay as possible. On the other hand, it is important that memory devices be as compact as possible so that a large number can be produced on each wafer. Making memory devices compact not only minimizes the cost of the memory devices, but it also reduces propagation delays by keeping the distance between nodes be as short as possible. Yet a compact design can be achieved only by making conductors as thin as possible, thus making their resistance relatively high, and placing the conductors as close as possible to other conductors and circuit components, thus making their capacitance relatively high. For these reasons, there is a practical limit to the degree to which signal propagation delays can be reduced.

One application in which signal propagation delay is particularly problematic is coupling data signals through input/output ("I/O") or read/write ("R/W") lines extending though memory banks in a DRAM. With reference to FIG. 1, several memory banks 100, in this example, eight memory banks 100(1)–100(8), are fabricated on a semiconductor substrate 104. Each of the memory banks 100 includes two rows of memory cell arrays 108, 110 which, in this example, each contain 32 memory cell arrays 108(1)–108(32) and 110(1)–110(32). The memory cells (not shown) in each array 108, 110 are selectively coupled to column circuits 114 adjacent each of the arrays 108, 110. Each of the column circuits 114 includes a sense amplifier 116 for each column in the memory array and a column decoder 118. The sense amplifier 116 determines the voltage to which a memory cell that is coupled to the sense amplifier 116 is charged and outputs a corresponding data bit. The column decoder 118 decodes a column address and selects one of the sense amplifiers corresponding to the decoded column address. A data bit is then coupled from the selected sense amplifiers 116 in each array 108, 110 to a respective I/O line 120. Therefore, since there are 32 arrays 108, 110 in each of two rows, there are a total of 64 I/O lines 120, and each memory read access produces 64 bits of read data.

The column decoders 118 and I/O lines 120 are also used for write accesses. In a write access, 64 bits of write data are coupled through the I/O lines 120, and the column decoders 120 couple one bit of write data to a column of memory cells in each of the arrays 108, 120. The I/O lines 120 are therefore bi-directional since they are used to couple read data from the arrays 108, 110 and write data to the arrays 108, 110.

The rate at which memory read and write accesses can occur depends, at least in part, on the rate at which data bits can be coupled through the I/O lines 120. For a memory write, the 64 write data bits are coupled to the I/O lines 120 at substantially the same time. However, the memory write cannot be completed until a write data bit has been coupled all of the way to the farthest arrays 108(1), 110(1). Similarly, in a memory read, the 64 read data bits are coupled from the column decoders 118 to the I/O lines 120 at substantially the same time. But the read data cannot be coupled to other circuits until a read data bit has been coupled from the farthest arrays 108(1), 110(1). The increasing capacity of memory arrays 108, 110 and the increasing number of arrays 108, 110 in each bank, which is required to increase the storage capacity of memory devices, results in ever longer I/O lines 120. These longer I/O lines threaten to limit the memory bandwidth of memory devices.

The manner in which a digital signal is delayed as it is coupled through a capacitive signal line will be apparent from the graph shown in FIG. 2 in which time is plotted along the horizontal axis and signal level is plotted along the vertical axis. At time $T_0$, one node of the signal line quickly transitions from low to high to produce the signal 130. However, because of the capacitance and resistance of the signal line, the line must be charged by the signal 130. As a result, the signal 130 produces a signal 134 at a distant node that increases much more slowly than the signal 130. If a circuit (not shown) coupled to the distant node detects a level transition at a transition voltage level $V_{TRANS}$, the circuit will not detect the transition of the signal 130 until $T_1$. Thus, the signal 130 is propagated between the two nodes with a propagation delay of $T_1$. As mentioned above, such delays can be problematic in memory devices, such as in coupling signals through the I/O lines 120.

In the past, various attempts have been made to increase the speed at which digital signals are coupled through signal lines other than by altering the electrical properties of the signal lines. For example, one or more repeaters, such as inverters, have been coupled in series with the signal line to reduce the delay in detecting a signal transition. The manner in which an inverter can reduce propagation delays can be seen from the graph of FIG. 3. At time $T_0$, one node of the signal line again quickly transitions from low to high to produce the signal 130. Again, the signal 130 must charge the line because of its capacitance. However, two inverters (not shown) are coupled to the signal line at first and second nodes that are one-third and two-thirds, respectively, the distance to a node where the signal 134 was produced in the example of FIG. 2. A signal 140 at the first node where the first inverter was located, a signal 144 at the second node where the second inverter was located, and a signal 148 at the node where the signal was produced in FIG. 2 are shown in FIG. 3 (this example ignores the inverting nature of the signal for purposes of clarity). Although the signals 140, 144 still initially increase relatively slowly, as soon as they reaches the threshold of the respective inverter they quickly transitions from low-to-high. As a result, the signal 148 increases faster than the signal 130 shown in FIG. 2, and it therefore reaches the transition voltage level $V_{TRANS}$ at time $T_2$, which is an earlier time than the time $T_1$, that the signal 134 reached the voltage level $V_{TRANS}$.

Although inverters can reduce signal line propagation delays, the use of inverters can create other problems. For example, inverters convert what would otherwise be bi-directional signal lines to unidirectional signal lines so that twice as many signal lines are required to couple signals in two directions. The use of inverters, for example, would require that the 64 I/O lines 120 used in each memory bank 100 in the example of FIG. 1 be increased to 128 I/O lines 120. However, doing so would only serve to make the memory banks 100 less compact and/or the signal lines even closer together, thereby tending to increase signal propagation delays.

Another approach to reducing signal propagation delay in I/O lines 120 is to bias or equilibrate the lines at the midpoint of the voltages of the signals coupled through the lines. For example, the I/O lines 120 can be equilibrated to $V_{CC}/2$, where the signals coupled through the signals lines will transition between $V_{CC}$ and zero volts. Equilibrating the I/O lines to $V_{CC}/2$ reduces signal propagation delay because the voltage in each signal line must transition only half of the voltage between zero volts and $V_{CC}$. In contrast, in the example shown in FIG. 2, the voltage in the signal line must transition between almost 100% of the two voltage levels of the signal coupled through the line. While biasing the I/O lines 120 to $V_{CC}/2$ can reduce signal propagation delay, it requires additional circuitry and complexity, and it only marginally reduces signal propagation delay.

Still another approach to reducing signal propagation delays is to couple "accelerator circuits" to the signal lines at spaced apart locations. Accelerator circuits are circuits that have both an input and an output coupled to the signal lines so that the signal lines remain bi-directional. Accelerator circuits therefore do not have the disadvantage of inverters, which require doubling the number of signal lines to couple signals in both directions. Examples of accelerator circuits are shown and described in an article by Dobbelaere et al. entitled *"Regenerative Feedback Repeaters for Programmable Interconnections"*, IEEE Journal of Solid-State Circuits, Vol. 30, No. 11, November 1995, and in an article by Wu et al., entitled *"Delay Models and Speed Improvement Techniques for RC Tree Interconnections Among Small-Geometry CMOS Inverters"*, IEEE Journal of Solid State Circuits, Vol. 25, No. 5, October 1990. Although conventional accelerator circuit can reduce signal propagation delays without producing the disadvantages of inverter, they nevertheless still require a significant delay period before they can react to a signal translation at a distant node because of the time required to drive the signal line to the transition voltage level $V_{TRANS}$ of the accelerator circuit.

Although the problem of signal propagation delays in memory device signal lines had been primarily explained with reference to the I/O lines 120 shown in FIG. 1, the problem is not limited to signal propagation delays in these lines. For example, address lines are generally numerous and fairly long so propagation delays in these lines also adversely affect the performance of memory devices. Other examples will be apparent to one skilled in the art. Digital signal propagation delays are also a problem in digital system other than memory devices.

There is therefore a need for an accelerator circuit and method that can be more effective than conventional accelerators in reducing signal propagation delays, particularly in memory devices and particularly in relatively long signal lines like I/O lines and address lines.

SUMMARY OF THE INVENTION

A system and method of accelerating the coupling of digital signals through respective signal lines precharges each of the signal lines. Alternating signal lines are preferably precharged to respective high and low voltages so that each signal line precharged to a high voltage is adjacent signal lines that have been precharged to a low voltage, and vice-versa. After the signal lines have been precharged, the system and method detects whether the voltage of the signal line has changed from the precharged voltage. In response to detecting that the voltage of the signal line has changed, the system and method drives the signal line toward a voltage that increases the voltage change. Where alternating signal lines are precharged to respective high and low voltages, the signal lines precharged to a low voltage are driven to a high voltage and the signal lines precharge to a high voltage are driven to a low voltage. As a result, any coupling from one signal line to an adjacent signal line tends to change the voltage of the signal line in a manner opposite the detected change. The system and method is particularly useful for accelerating the coupling of digital signals in memory devices, such as read data and write data signals coupled through I/O lines in a memory array.

DETAILED DESCRIPTION OF THE INVENTION

Figure 1:
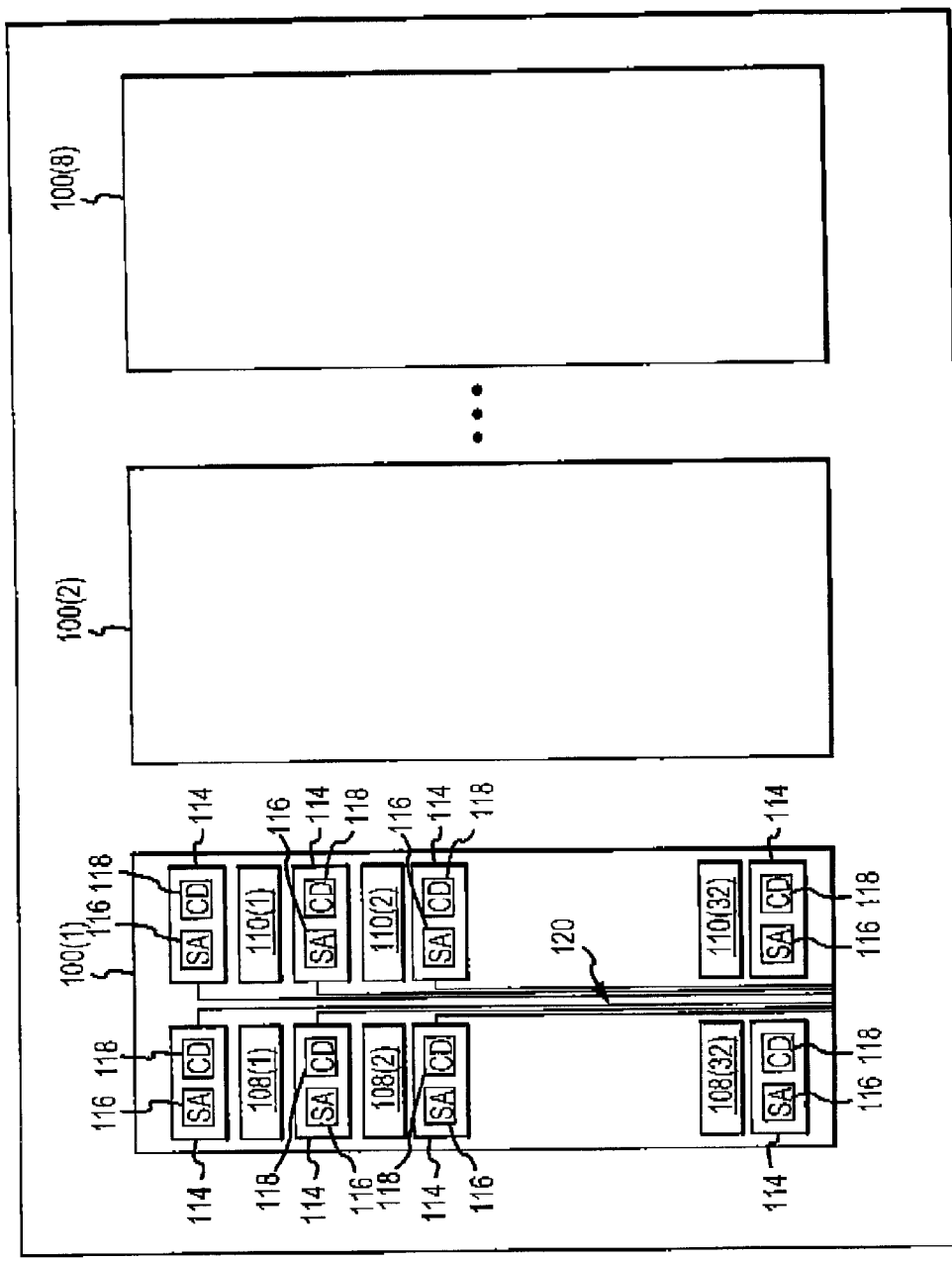
FIG. 1 is a block diagram of a portion of a conventional memory device showing several memory banks.
Figure 2:
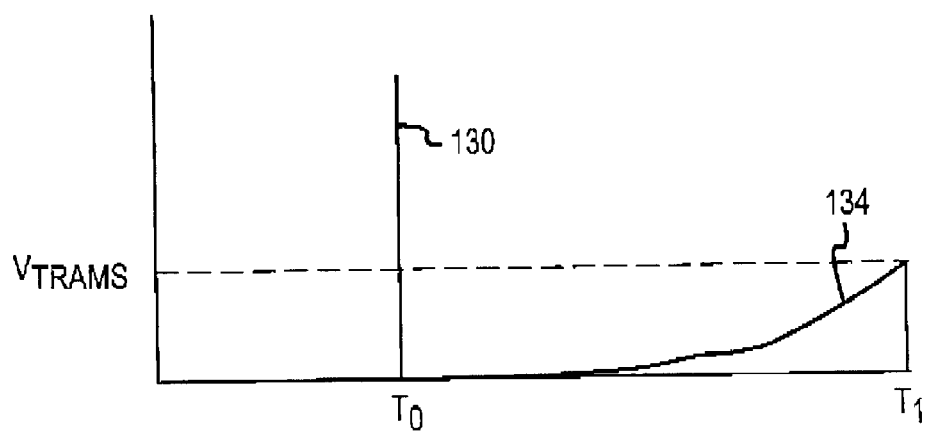
FIG. 2 is a graph showing the manner in which a signal is delayed as it is coupled through a signal line between two nodes.
Figure 3:
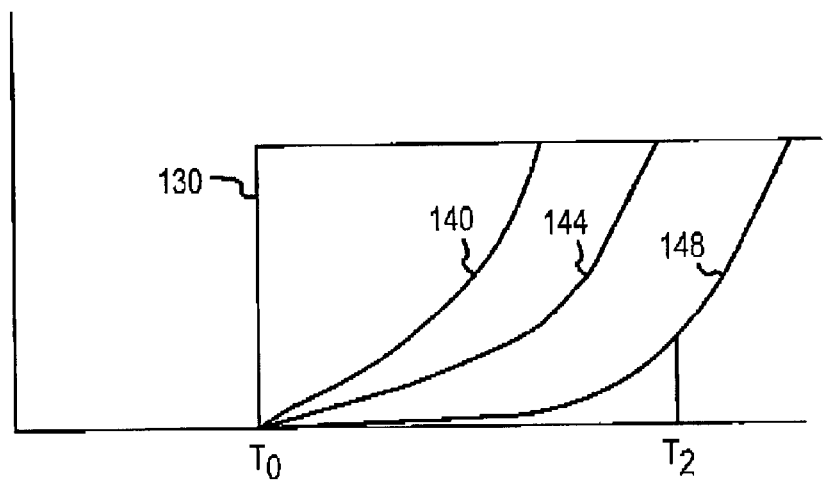
FIG. 3 is a graph showing the manner in which repeater circuits can somewhat reduce the signal propagation delay shown in FIG. 2.

The principles of one example of the present invention will now be described with reference to FIG. 4, which shows 4 I/O lines 200, 202, 204, 206. The I/O lines 200–204 are each coupled between a respective sense amplifier 116 in a respective memory array (not shown in FIG. 4) and a receiver circuit, which, in this example, is a DC sense amplifier ("DCSA") 210. The sense amplifiers 116 drive the I/O lines 200–206 between two logic levels, such as $V_{CC}$ and ground. Each of the I/O lines 200, 204 are coupled to a precharge high ("PH") circuit 220 that precharges the I/O lines 200, 204 to a voltage of $V_{CC}-V_T$, where $V_{CC}$ is the supply voltage and $V_T$ is a switching threshold voltage. Each of the I/O lines 200, 204 are also coupled to at least one accelerate low ("AL") circuits 224 that accelerates the transition of the I/O lines 200, 204 toward a low logic level, such as zero volts.

Similarly, the I/O lines 202, 206 are coupled to respective precharge low ("PL") circuits 230 that precharge the I/O lines 202, 206 to a voltage of $V_T$, where $V_T$ is again a switching threshold voltage. The I/O lines 202, 206 are also coupled to respective accelerate high ("AH") circuits 234 that accelerate the transition of the I/O lines 200, 204 toward a high level, such as $V_{CC}$.

In operation, assume first that the sense amplifiers 116 drive the I/O lines 200, 204 toward zero volts after they have been precharged by the precharge high circuits 220 to $V_{CC}-V_T$. If the accelerate low circuits 224 have a threshold voltage of $V_{CC}-V_T$, the accelerate low circuits 224 will respond to the falling edge of the signal from the sense amplifiers 116 as soon as the voltages on the I/O lines 200, 204 start to drop below $V_{CC}-V_T$ responsive to the high-to-low edge of the signal from the sense amplifiers 116. By reacting almost immediately to the falling voltage on the I/O lines 200, 204 and then accelerating the transition of the I/O lines 200, 204 to a low logic level, there is significantly less delay in coupling the low logic level to the DC sense amplifiers 210 compared to prior art circuits.

If, instead of driving the I/O lines 200, 204 low, the sense amplifiers 116 drive the I/O lines 200, 204 high to $V_{CC}$, the voltage on the I/O lines 200, 204 will change very little. In fact, there is no need for the voltage on the I/O lines 200, 202 to change at all since the DC sense amplifiers 210 will interpret $V_{CC}-V_T$ as a voltage corresponding to the same logic level as $V_{CC}$. Thus, there is no delay in coupling the high logic level to the DC sense amplifiers 210.

The precharge low circuits 230 and the accelerate high 234 circuits operate with the I/O lines 202, 206 in a similar manner, but in the opposite direction. Instead of precharging the I/O lines 202, 206 to $V_{CC}-V_T$, the precharge low circuits 230 precharge the I/O lines 202, 206 to $V_T$. Next, assume the sense amplifiers 116 then drive the I/O lines 202, 206 toward $V_{CC}$. If the accelerate high circuits 234 have a threshold voltage of $V_T$, the accelerator high circuits 234 will respond to the rising edge of the signal from the sense amplifiers 116 as soon as the voltages on the I/O lines 202, 206 start to rise above $V_T$ responsive to the low-to-high edge of the signal from the sense amplifiers 116. By reacting almost immediately to the rising voltage on the I/O lines 202, 206 and then accelerating the transition of the I/O lines 202, 206 to a high logic level, there is significantly less delay in coupling the low logic level to the DC sense amplifiers 210 compared to prior art circuits.

If the sense amplifiers 116 drive the I/O lines 202, 206 low to zero volts, the voltage on the I/O lines 202, 206 need not change at all for the DC sense amplifiers 210 to interpret the voltage $V_T$ as a voltage corresponding to the same logic level as zero volts.

Precharging the I/O lines 200–206 to the threshold voltages of accelerators can greatly reduce the propagation delays in the I/O lines 200–206. However, the potential disadvantage of precharging the I/O lines in this manner is that voltage transients coupled from one I/O line 200–206 to another could theoretically cause an accelerator circuit to inadvertently transition the I/O line 200–206. For example, if the I/O line 200 is precharged to $V_{CC}-V_T$, and a negative voltage transient is coupled to the I/O line 200, the accelerator circuit will drive the I/O line 200 to zero volts. Similarly, if the I/O line 202 is precharged to $V_T$, and a positive voltage transient is coupled to the I/O line 202, the accelerator circuit will drive the I/O line 200 to $V_{CC}$.

Figure 4:
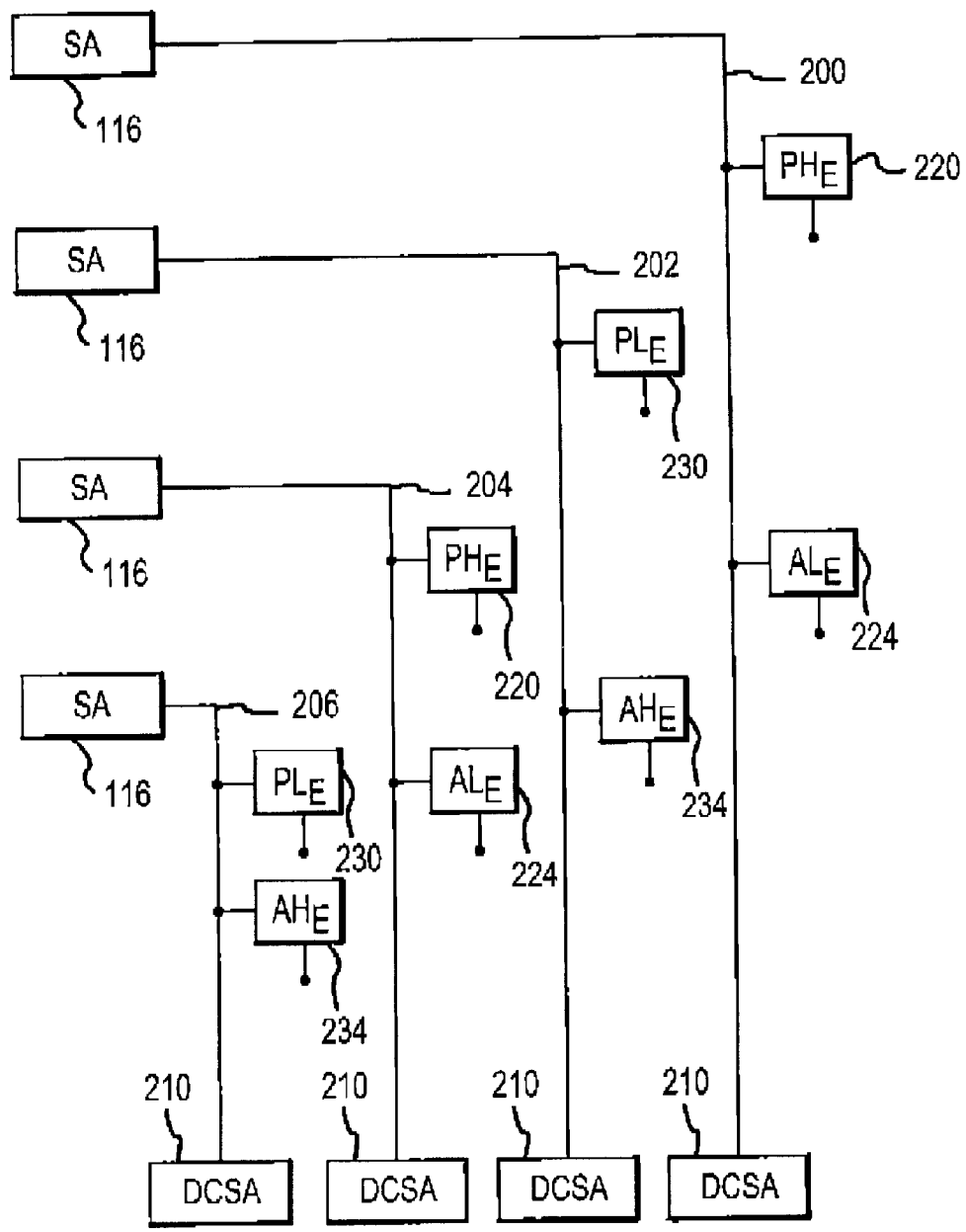
FIG. 4 is a block diagram showing one example of a system for accelerating signal propagation through I/O lines in a memory device.

The example of the invention shown in FIG. 4 is configured to avoid inadvertent triggering of the accelerator circuits by voltage transients coupled from one I/O line 200–206 to the other. More specifically, since I/O lines 202, 206 are precharged to $V_T$, any substantial transition of the I/O lines 202, 206 will be positive, i.e., from $V_T$ to $V_{CC}$. If this positive transition causes any voltage transient to be coupled to the adjacent I/O lines 200, 204, the voltage transient will increase the voltage of the I/O lines 200, 204 above $V_{CC}-V_T$. The voltage transient thus tends to change the voltage on the I/O lines 200, 204 away from a voltage that would cause inadvertent triggering of the accelerator circuits.

In a similar manner, since I/O lines 200, 204 are precharged to $V_{CC}-V_T$, any substantial transition of the I/O lines 200, 204 will be negative, i.e., from $V_{CC}-V_T$ to $V_T$. Therefore, if this negative transition causes any voltage transient to be coupled to the adjacent I/O lines 202, 206, the voltage transient tends to decrease the voltage on the I/O lines 202, 206 below the voltage $V_T$ that would cause inadvertent triggering of the accelerator circuits.

As shown in FIG. 4, the precharge circuits 220, 230 and the accelerate circuits 224, 234 are each provided with an enable input ("EN") so that they can be individually enabled. In operation, the accelerate circuits 224, 234 are disabled when the precharge circuits 220, 230 are enabled, and the precharge circuits 220, 230 are disabled when the accelerate circuits 224, 234 are enabled. If the accelerate circuits 224, 234 and the precharge circuits 220, 230 were not alternately enabled, the accelerate circuits 224, 234 and the precharge circuits 220, 230 might simultaneously drive the I/O lines 200–206 in opposite directions under some circumstances.

Although FIG. 4 illustrates and the preceding explains the operation of the accelerate circuits 224, 234 and the precharge circuits 220, 230 for coupling read data from the sense amplifiers 116 to the CD sense amplifiers 210, the accelerate circuits 224, 234 and the precharge circuits 220, 230 operate in the same manner when write data are coupled to the column circuits 114 (FIG. 1). The accelerate circuits 224, 234 and the precharge circuits 220, 230 therefore allow the I/O lines to be bi-directional. Also, although FIG. 4 shows one example of an accelerator system in the context of reducing propagation delays in I/O lines, it will be understood that it may be used for the same purposes in coupling signals through other signal lines, such as address lines, in memory devices, and it may be used in devices other than memory devices.

Figure 5:
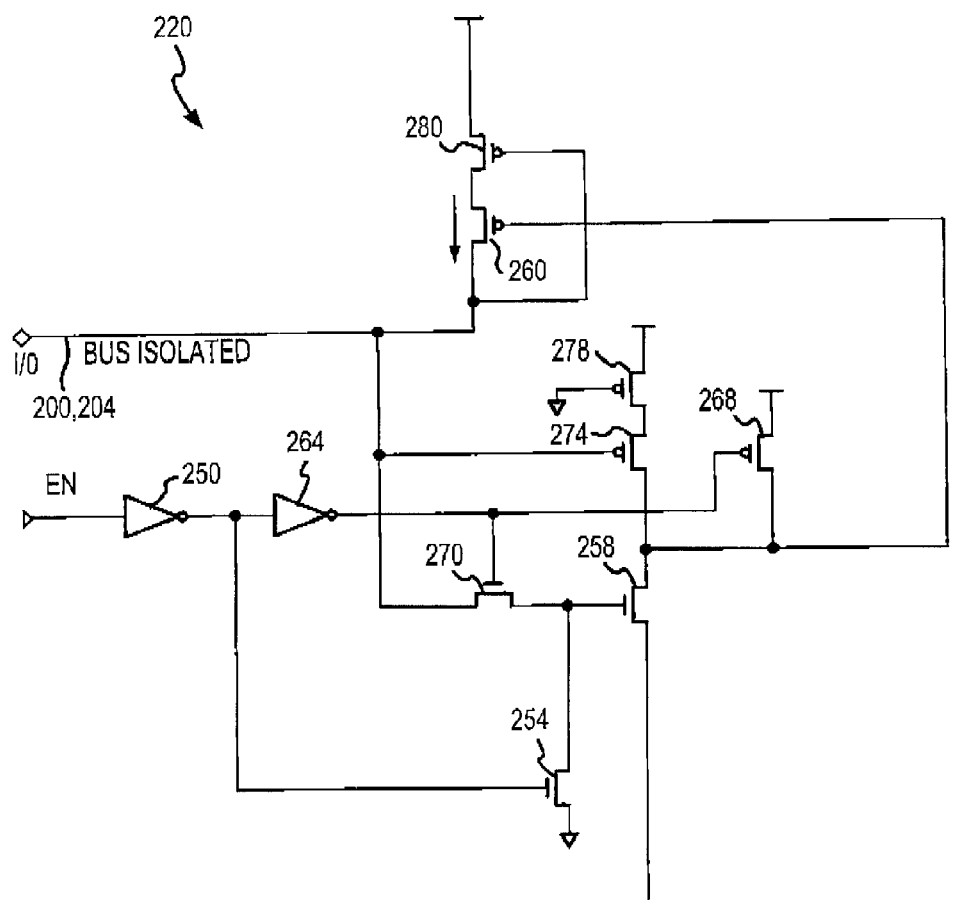
FIG. 5 is a schematic and logic diagram showing one example of a precharge high circuit used in the system of FIG. 4.

One example of the precharge high circuit 220 is shown in FIG. 5. The precharge high circuit 220 has an enable EN input that is active high when the precharge high circuit 220 is precharging the I/O lines 200, 204 to $V_{CC}-V_T$. Precharging is initiated by a transistor in the DCSA 210 after the DCSA has received valid data from the last active cycle. The precharge circuit 220 acts as an accelerator to speed up the precharging of the whole I/O line 200, 204. The enable input EN is inactive low when the accelerator low circuits 224 are enabled to accelerate a signal transition on the I/O lines 200, 204.

The enable EN input is coupled through a first inverter 250 to the gate of an NMOS transistor 254 so that the transistor 254 is ON when the precharge circuit 220 is not enabled. The transistor 254 then holds the gate of a second NMOS transistor 258 at ground so that the transistor 258 is OFF. As a result, a PMOS transistor 260, which is used to drive the I/O line 120, 124 to $V_{CC}-V_T$, is not turned ON by having its gate coupled to ground. Instead, a low produced by coupling the EN signal through another inverter 264 turns on a PMOS transistor 268 to apply $V_{CC}$ to the gate of the transistor 260 thereby holding it OFF. The low at the output of the inverter 264 is also applied to an NMOS transistor 270 to turn OFF the transistor 270, thereby isolating the transistor 254 from the I/O line 200, 204 so that the I/O line is not pulled to ground. Instead, the I/O line is effectively isolated from the circuit 220. The I/O line 200, 206 is coupled to the gate of a PMOS transistor 274, which receives $V_{CC}$ from a PMOS transistor 278 that is always ON, but the impedance of the gate of the transistor 274 is sufficiently high that it does not load the I/O line 200, 204. Although the voltage of the I/O line 200, 204 may turn the transistor 274 ON, the line to which it is coupled is already at $V_{CC}$ because the transistor 268 is ON, as previously explained.

When the precharge high circuit 220 is enabled, the high EN signal coupled through the inverter 250 turns OFF the NMOS transistor 254 so that the NMOS transistor 258 can be turned ON. As will be explained, the transistor 258 senses the voltage on the I/O lines 200, 204. The high EN signal also causes the inverter 264 to output a high that turns ON the isolation transistor 270 to be coupled the I/O lines 200, 204 to the gate of the sense transistor 258. The isolation transistor 270 will be ON as long as the voltage of the I/O lines 200, 204 is less than $V_{CC}-V_T$. The PMOS transistor 274 will also be ON to draw current through the transistor 278, but the current will be shunted to ground through the sense transistor 258. The transistors 274, 278 thus provide current for the sense transistor 258 when the precharge circuit 220 is enabled.

During precharge, the voltage of the I/O lines 200, 204 reaches $V_T$ and the sense transistor 258 turns ON and pulls the gate of the drive transistor 260 low to turn ON the transistor 260. The transistor 258 can pull the gate of the drive transistor 260 low because the high at the output of the inverter also turns OFF the PMOS transistor 268, which was holding the gate of the drive transistor 260 at $V_{CC}$. Since the voltage of the voltage of the I/O lines 200, 204 is assumed to be less than $V_{CC}-V_T$, a PMOS transistor 280 having its gate coupled to the I/O lines 200, 206 is also turned ON. As a result, current flows through the transistors 260, 280 to drive the I/O lines 200, 204 toward $V_{CC}-V_T$.

As the voltage of the I/O lines 200, 204 increases, it will eventually reach a voltage of $V_{CC}-V_T$. The current through the transistor 260 also starts declining because the transistor 280 is diode coupled through the transistor 260 and thus starts turning OFF. The flow of current to the I/O lines 200, 204 thus terminates when the voltage of the I/O lines reaches $V_{CC}-V_T$.

Figure 6:
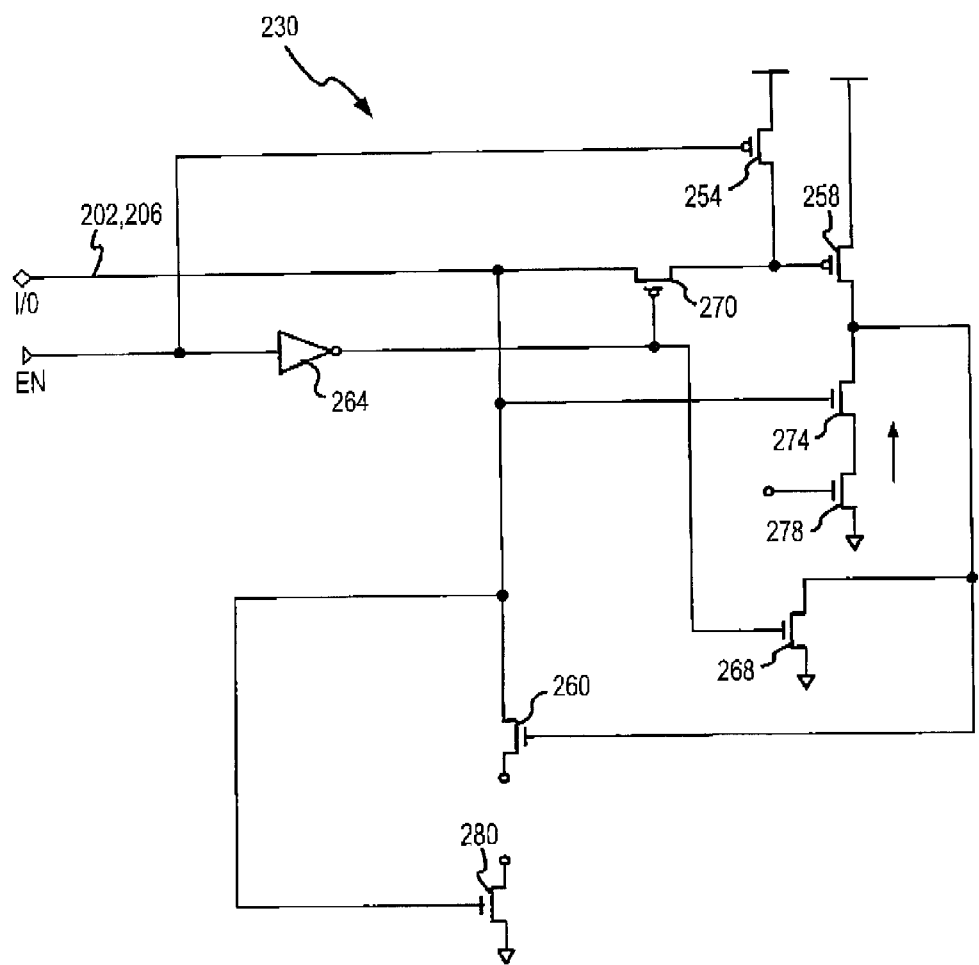
FIG. 6 is a schematic and logic diagram showing one example of a precharge low circuit used in the system of FIG. 4.

One example of the precharge low circuit 230 is shown in FIG. 6. The precharge low circuit 230 has essentially the same topography as the precharge high circuit 220 shown in FIG. 5. Therefore, the circuit components of the precharge low circuit 230 have been provided with the same reference numerals as the corresponding circuit components in the precharge high circuit 220. Except for differences in voltage polarity and the substitution of NMOS transistors for PMOS transistors and vice-versa, the precharge low circuit 230 operates in substantially the same manner as the precharge high circuit 220 and it has substantially the same topography. Therefore, in the interests of brevity and clarity, an explanation of its topography and operation will not be repeated.

Figure 7:
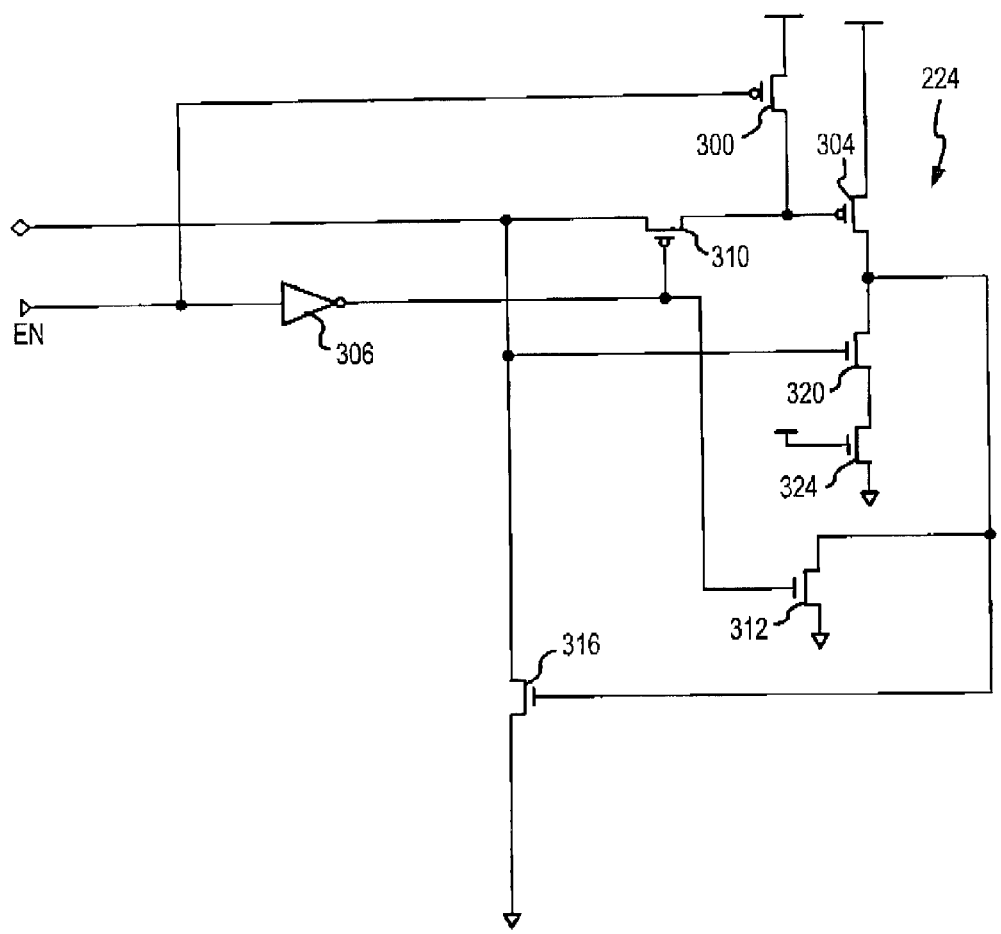
FIG. 7 is a schematic and logic diagram showing one example of an accelerate low circuit used in the system of FIG. 4.

One example of the accelerate low circuit 224 of FIG. 4 is shown in FIG. 7. The circuit is selectively enabled to detect a drop in voltage of the I/O lines 200, 204 below $V_{CC}-V_T$ and then drive the lines 200, 204 to zero volts. When the enable EN signal is inactive low, a PMOS transistor 300 is turned ON to couple $V_{CC}$ to the gate of a PMOS sense transistor 304, thereby holding the transistor 304 OFF. The low EN signal causes an inverter 306 to output a high that turns OFF a PMOS transistor 310 to isolate the I/O lines 200, 204 from the ON transistor 300 so that the I/O lines are not pulled to $V_{CC}$. The high at the output of the inverter 306 also turns ON an NMOS transistor 312. The transistor 312 then holds the gate of an NMOS drive transistor 316 at zero volts to maintain the transistor 316 OFF so that it cannot couple the I/O lines 200, 204 to ground. Therefore, when the accelerate low circuit 224 is not enabled, it is effectively isolated from the I/O lines 200, 204.

When the accelerate low circuit 224 is enabled by a high EN signal, the transistor 300 is turned OFF to allow the sense transistor 304 to turn ON. The high EN signal causes the inverter 306 to output a low, which turns ON the PMOS transistor 310 to couple the sense transistor 304 to the I/O lines 200, 204. The low at the output of the inverter 306 also turns OFF the NMOS transistor 312 to allow the drive transistor 316 to subsequently be turned ON.

Since the I/O lines 200, 204 had been precharged to $V_{CC}-V_T$ prior to enabling the accelerate low circuit 224, the voltage of the I/O lines 200, 204 is assumed to be at $V_{CC}-V_T$. As a result, an NMOS transistor 320 is turned ON to couple the gate of the sense transistor 316 to ground through an NMOS transistor 324 that is always biased ON. However, the accelerate low circuit 224 has no effect on the I/O lines 200, 224 until the voltage on the I/O lines drops below $V_{CC}-V_T$.

When the voltage on the I/O lines drops below $V_{CC}-V_T$, the sense transistor 304 turns ON. The transistors 320, 324 act as a current sink to allow current to flow through the sense transistor 304. However, the ON sense transistor pulls the gate of the drive transistor 316 high to turn ON the transistor 316. The drive transistor 316 then couples the I/O lines 200, 204 to ground. The voltage of the I/O lines 200, 204 is thus quickly driven toward zero volts to accelerate the transition of signals on the I/O lines 200, 204.

Figure 8:
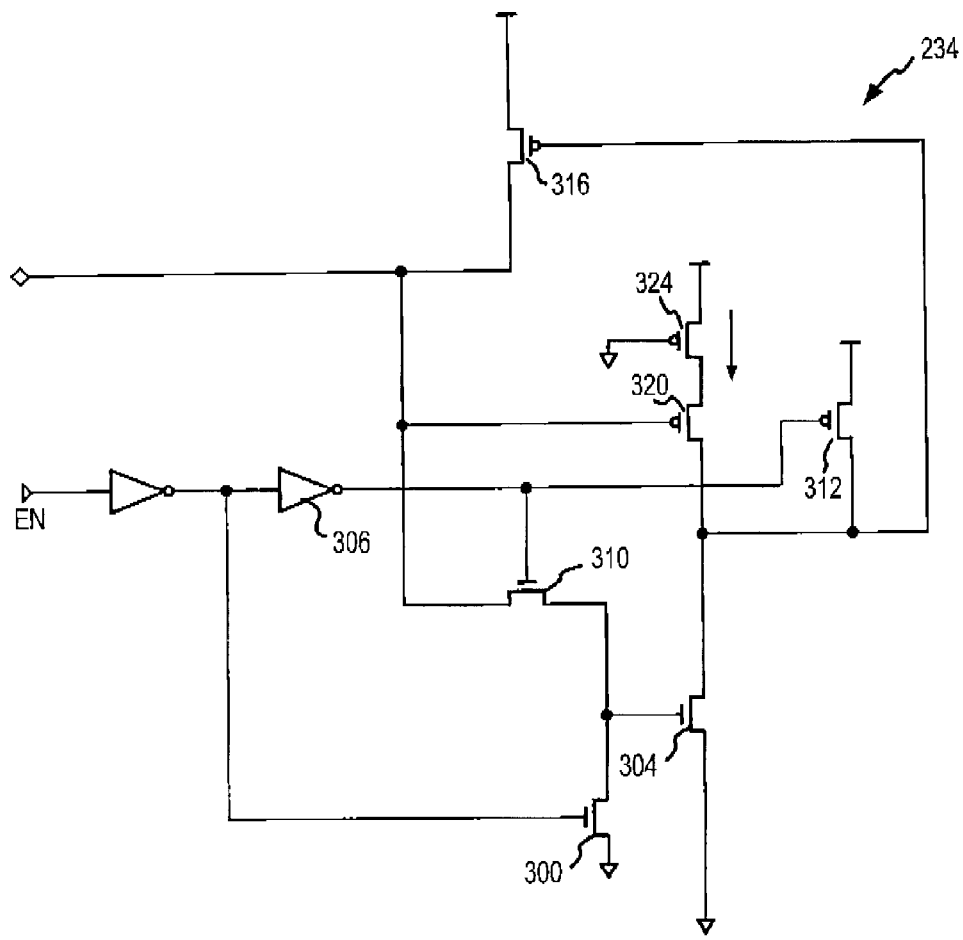
FIG. 8 is a schematic and logic diagram showing one example of an accelerate high circuit used in the system of FIG. 4.

One example of the accelerate high circuit 234 of FIG. 4 is shown in FIG. 8. Again, the accelerate high circuit 234 has essentially the same topography as the accelerate low circuit 224 shown in FIG. 7 except for differences in voltage polarity and the substitution of NMOS transistors for PMOS transistors and vice-versa. The circuit components of the accelerate high circuit 234 have therefore been provided with the same reference numerals as the corresponding circuit components in the accelerate low circuit 224, and, in the interests of brevity and clarity, an explanation of their topography and operation will not be repeated.

Figure 9:
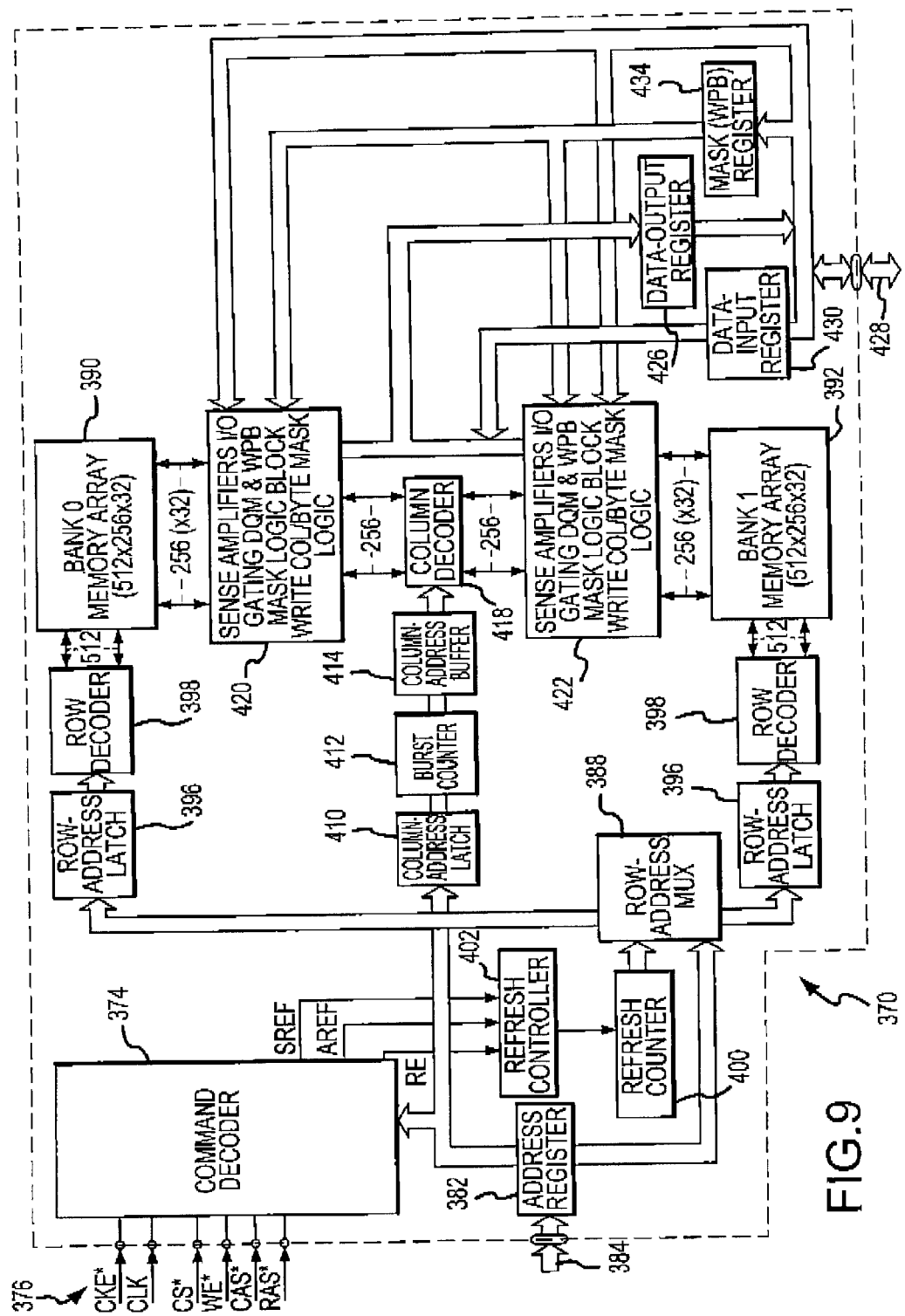
FIG. 9 is a block diagram of one example of a memory device using the system of FIG. 4.

One embodiment of a memory device using the signal accelerator system of FIG. 4 is shown in FIG. 9. The illustrated memory device is a conventional synchronous dynamic random access memory ("SDRAM") 370 that can utilize the signal accelerator system described herein or some other signal accelerator system in accordance with the present invention. However, it will be understood that the present invention can also be used in other types of memory devices or other circuits. The operation of the SDRAM 370 is controlled by a command decoder 374 responsive to high level command signals received on a control bus 376. These high level command signals, which are typically generated by a memory controller (not shown in FIG. 9), are a clock enable signal CKE*, a clock signal CLK, a chip select signal CS*, a write enable signal WE*, a row address strobe signal RAS*, and a column address strobe signal CAS*, in which the "*" designates the signal as active low. The command decoder 374 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

The SDRAM 370 includes an address register 382 that receives either a row address or a column address on an address bus 384. The address bus 384 is generally coupled to a memory controller (not shown in FIG. 9). Typically, a row address is initially received by the address register 382 and applied to a row address multiplexer 388. The row address multiplexer 388 couples the row address to a number of components associated with either of two memory arrays 390, 392 depending upon the state of a bank address bit forming part of the row address. As mentioned previously, the signal lines coupling the address to the memory arrays 390, 392 can be relatively long and can therefore benefit by using the accelerate system shown in FIG. 4 or some other example of the present invention. Associated with each of the memory arrays 390, 392 is a respective row address latch 396, which stores the row address, and a row decoder 398, which decodes the row address and applies corresponding signals to one of the arrays 390 or 392.

The row address multiplexer 388 also couples row addresses to the row address latches 396 for the purpose of refreshing the memory cells in the arrays 390, 392. The row addresses are generated for refresh purposes by a refresh counter 400, which is controlled by a refresh controller 402. The refresh controller 402 is, in turn, controlled by the command decoder 474.

After the row address has been applied to the address register 482 and stored in one of the row address latches 496, a column address is applied to the address register 382. The address register 382 couples the column address to a column address latch 410. Depending on the operating mode of the SDRAM 370, the column address is either coupled through a burst counter 412 to a column address buffer 414, or to the burst counter 412 which applies a sequence of column addresses to the column address buffer 414 starting at the column address output by the address register 382. In either case, the column address buffer 414 applies a column address to a column decoder 418, which applies various column signals to corresponding sense amplifiers and associated column circuitry 420, 422 for one of the respective arrays 390, 392. The signal lines coupling column address signals to the memory arrays 390, 392 can also be relatively long and can therefore also benefit by using the accelerate system shown in FIG. 4 or some other example of the present invention. The column circuitry 420, 422 includes the sense amplifiers 116 (FIG. 4).

Data to be read from one of the arrays 390, 392 is coupled to the column circuitry 420, 422 for one of the arrays 390, 392, respectively. The read data is then coupled to a data output register 426, which applies the read data to a data bus 428. Data to be written to one of the arrays 390, 392 are coupled from the data bus 428 through a data input register 430 to the column circuitry 420, 422 where the write data are transferred to one of the arrays 390, 392, respectively. As previously explained, the read data are coupled from the sense amplifiers 116 in the column circuitry 420, 422 through the I/O lines 200–206 to a DC sense amplifier 210 (not shown in FIG. 4), and from the DC sense amplifier 210 to the data output register 426. Write data are coupled from the data input register 430 to a write driver (not shown), which couples the write data to the column circuitry 420, 422 through the I/O lines 200–206. As previously explained, the I/O lines 200–206 coupling the write data and read data to and from, respectively, the memory arrays 390, 392 can be relatively long and therefore use the accelerate system shown in FIG. 4 or some other example of the present invention. A mask register 434 may be used to selectively alter the flow of data into and out of the column circuitry 420, 422, such as by selectively masking data to be read from the arrays 390, 392.

Figure 10:
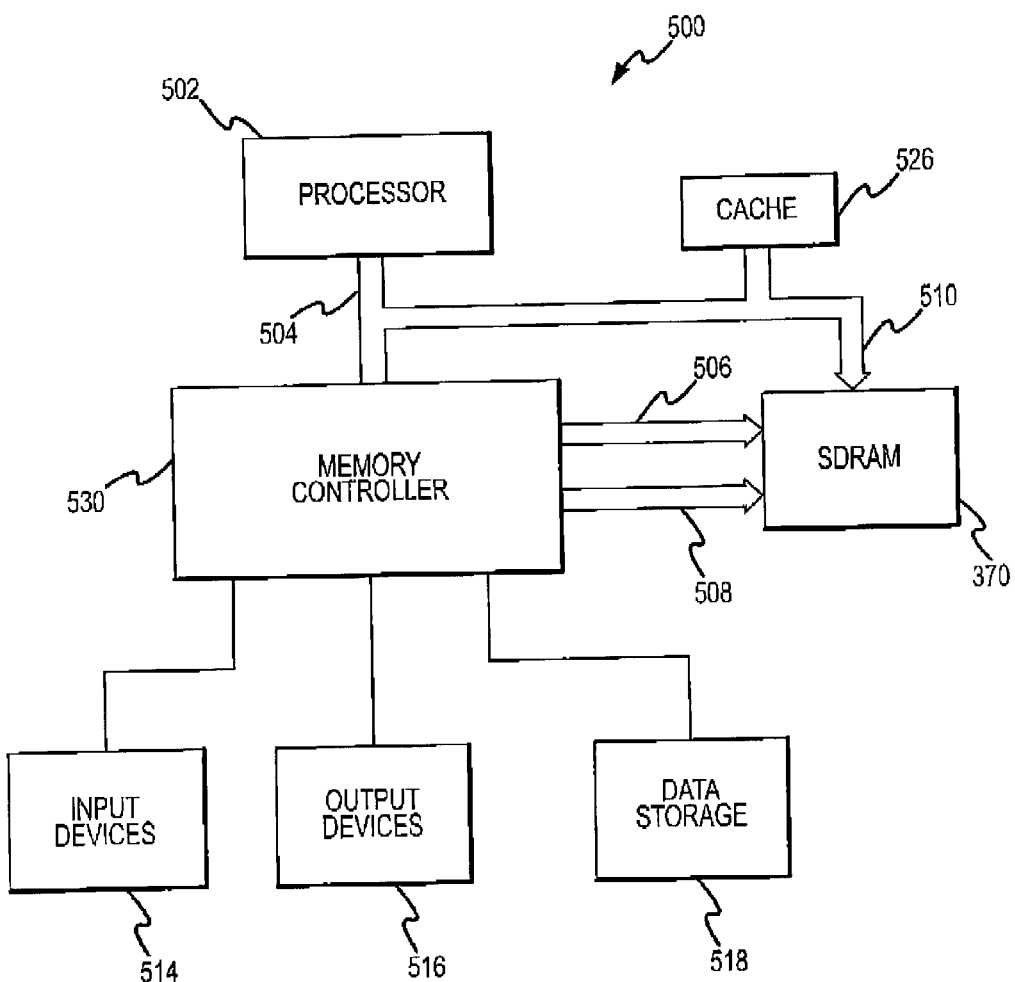
FIG. 10 is a block diagram of one example of a computer system using the memory device of FIG. 9.

FIG. 10 shows an embodiment of a computer system 400 that may use the SDRAM 370 or some other memory device that contains one or more examples of the signal accelerate system of the present invention. The computer system 500 includes a processor 502 for performing various computing functions, such as executing specific software to perform specific calculations or tasks. The processor 502 includes a processor bus 504 that normally includes an address bus 506, a control bus 508, and a data bus 510. In addition, the computer system 500 includes one or more input devices 514, such as a keyboard or a mouse, coupled to the processor 502 to allow an operator to interface with the computer system 500. Typically, the computer system 500 also includes one or more output devices 516 coupled to the processor 502, such output devices typically being a printer or a video terminal. One or more data storage devices 418 are also typically coupled to the processor 402 to store data or retrieve data from external storage media (not shown). Examples of typical storage devices 518 include hard and floppy disks, tape cassettes, and compact disk read-only memories (CD-ROMs). The processor 502 is also typically coupled to a cache memory 526, which is usually static random access memory ("SRAM") and to the SDRAM 370 through a memory controller 530. The memory controller 530 includes an address bus coupled to the address bus 384 (FIG. 9) to couple row addresses and column addresses to the SDRAM 370, as previously explained. The memory controller 530 also includes a control bus that couples command signals to a control bus 376 of the SDRAM 370. The external data bus 428 of the SDRAM 370 is coupled to the data bus 510 of the processor 502, either directly or through the memory controller 530.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A signal accelerator system for accelerating the coupling of digital signals through a plurality of signal lines extending adjacent to each other, the system comprising:

a respective precharge low circuit coupled to alternate ones of the signal lines, each of the precharge low circuits being operable to precharge the signal line to which it is coupled to a precharge low voltage when the precharge low circuit is enabled;

a respective precharge high circuit coupled to each of the signal lines to which a precharge low circuit is not coupled, each of the precharge high circuits being operable to precharge the signal line to which it is coupled to a precharge high voltage when the precharge high circuit is enabled;

an accelerate high circuit coupled to each of the signal lines to which a precharge low circuit is coupled, each of the accelerate high circuits being operable to drive the signal line to which it is coupled toward the precharge high voltage responsive to detecting that the voltage of the signal line is greater than a predetermined low voltage; and an accelerate low circuit coupled to each of the signal lines to which a precharge high circuit is coupled, each of the accelerate low circuits being operable to drive the signal line to which it is coupled toward the precharge low voltage responsive to detecting that the voltage of the signal line is less than a predetermined high voltage.

2. The signal accelerator system of claim 1 wherein the predetermined high voltage is substantially equal to the precharge high voltage and the predetermined low voltage is substantially equal to the precharge low voltage.

3. The signal accelerator system of claim 2 wherein the predetermined high voltage and the precharge high voltage are substantially equal to $V_{CC}-V_T$, and the predetermined low voltage and the precharge low voltage are substantially equal to $V_T$, where $V_{CC}$ is a power supply voltage and $V_T$ is a transistor threshold voltage.

4. The signal accelerator system of claim 3 wherein each of the accelerate high circuits is operable to drive the signal line to which it is coupled toward $V_{CC}$, and each of the accelerate low circuits is operable to drive the signal line to which it is coupled toward zero volts.

5. The signal accelerator system of claim 4 wherein each of the accelerate high circuits is operable to terminate driving the signal line to which it is coupled toward $V_{CC}$ responsive to the signal line reaching a voltage of $V_{CC}-V_T$, and each of the accelerate low circuits is operable to terminate driving the signal line to which it is coupled toward zero volts responsive to the signal line reaching a voltage of $V_T$.

6. The signal accelerator system of claim 1 wherein each of the precharge high and precharge low circuits comprise:

a drive circuit that drives the signal line toward the precharge voltage when the precharge circuit is enabled, the drive circuit driving the signal line toward the precharge voltage until a drive terminate signal is generated; and a sense circuit that senses when the voltage on the signal line reaches the precharge voltage, the sense circuit being operable to generate the drive terminate signal when the sense circuit senses that the voltage on the signal line has reached the precharge voltage.

7. The signal accelerator system of claim 6 wherein each of the precharge high and precharge low circuits further comprises an isolation circuit the effectively isolates the precharge circuit from the signal line when the precharge circuit is not enabled.

8. The signal accelerator system of claim 1 wherein each of the accelerate high and accelerate low circuits comprise:

a sense circuit that is operable to sense when the voltage on the signal line to which the accelerate circuit is coupled is greater than the predetermined low voltage in the case of the accelerate high circuit and less than the predetermined high voltage in the case of the accelerate low circuit, the sense circuit being operable to generate a drive signal responsive to sensing that the voltage on the signal line is greater than the predetermined low voltage in the case of the accelerate high circuit and less than the predetermined high voltage in the case of the accelerate low circuit; and a drive circuit that is responsive to the drive signal to drive the signal line to which it is coupled toward the precharge high voltage in the case of the accelerate high circuit and to drive the signal line to which it is coupled toward the precharge low voltage in the case of the accelerate low circuit.

9. The signal accelerator system of claim 8 wherein each of the accelerate high and accelerate low circuits further comprises an isolation circuit the effectively isolates the accelerate circuit from the signal line when the accelerate circuit is not enabled.

10. A signal accelerator system for accelerating the coupling of digital signals through a plurality of signal lines, the system comprising:

a respective precharge low circuit coupled to a plurality of the signal lines, each of the precharge low circuits being operable to precharge the signal line to which it is coupled to a precharge low voltage when the precharge low circuit is enabled; and an accelerate high circuit coupled to each of the signal lines to which a precharge low circuit is coupled, each of the accelerate high circuits being operable to drive the signal line to which it is coupled toward a predetermined high voltage responsive to detecting that the voltage of the signal line is greater than a predetermined low voltage.

11. The signal accelerator system of claim 10 wherein the predetermined low voltage is substantially equal to the precharge low voltage.

12. The signal accelerator system of claim 11 wherein the predetermined high voltage is substantially equal to $V_{CC}-V_T$, and the precharge low voltage is substantially equal to $V_T$, where $V_{CC}$ is a power supply voltage and $V_T$ is a transistor threshold voltage.

13. The signal accelerator system of claim 12 wherein each of the accelerate high circuits is operable to drive the signal line to which it is coupled toward $V_{CC}$.

14. The signal accelerator system of claim 13 wherein each of the accelerate high circuits is operable to terminate driving the signal line to which it is coupled toward $V_{CC}$ responsive to the signal line reaching a voltage of $V_{CC}-V_T$.

15. The signal accelerator system of claim 10 wherein each of the precharge low circuits comprise:

a drive circuit that drives the signal line toward the precharge low voltage when the precharge low circuit is enabled, the drive circuit driving the signal line toward the precharge low voltage until a drive terminate signal is generated; and a sense circuit that senses when the voltage on the signal line reaches the precharge low voltage, the sense circuit being operable to generate the drive terminate signal when the sense circuit senses that the voltage on the signal line has reached the precharge low voltage.

16. The signal accelerator system of claim 15 wherein each of the precharge low circuits further comprises an isolation circuit the effectively isolates the precharge low circuit from the signal line when the precharge low circuit is not enabled.

17. The signal accelerator system of claim 10 wherein each of the accelerate high circuits comprise:

a sense circuit that is operable to sense when the voltage on the signal line to which the accelerate high circuit is coupled is greater than the predetermined low voltage, the sense circuit being operable to generate a drive signal responsive to sensing that the voltage on the signal line is greater than the predetermined low voltage; and a drive circuit that is responsive to the drive signal to drive the signal line to which it is coupled toward the predetermined high voltage.

18. The signal accelerator system of claim 17 wherein each of the accelerate high circuits further comprises an isolation circuit the effectively isolates the accelerate high circuit from the signal line when the accelerate high circuit is not enabled.

19. A signal accelerator system for accelerating the coupling of digital signals through a plurality of signal lines, the system comprising:
   a respective precharge high circuit coupled to a plurality of the signal lines, each of the precharge high circuits being operable to precharge the signal line to which it is coupled to a precharge high voltage when the precharge high circuit is enabled; and
   an accelerate low circuit coupled to each of the signal lines to which a precharge high circuit is coupled, each of the accelerate low circuits being operable to drive the signal line to which it is coupled toward a predetermined low voltage responsive to detecting that the voltage of the signal line is less than a predetermined high voltage.

20. The signal accelerator system of claim 19 wherein the predetermined high voltage is substantially equal to the precharge high voltage.

21. The signal accelerator system of claim 20 wherein the predetermined low voltage is substantially equal to $V_T$, and the precharge high voltage is substantially equal to $V_{CC}-V_T$, where $V_{CC}$ is a power supply voltage and $V_T$ is a transistor threshold voltage.

22. The signal accelerator system of claim 21 wherein each of the accelerate low circuits is operable to drive the signal line to which it is coupled toward zero volts.

23. The signal accelerator system of claim 22 wherein each of the accelerate low circuits is operable to terminate driving the signal line to which it is coupled toward zero volts responsive to the signal line reaching a voltage of $V_T$.

24. The signal accelerator system of claim 19 wherein each of the precharge high circuits comprise:
   a drive circuit that drives the signal line toward the precharge high voltage when the precharge high circuit is enabled, the drive circuit driving the signal line toward the precharge high voltage until a drive terminate signal is generated; and
   a sense circuit that senses when the voltage on the signal line reaches the precharge high voltage, the sense circuit being operable to generate the drive terminate signal when the sense circuit senses that the voltage on the signal line has reached the precharge high voltage.

25. The signal accelerator system of claim 24 wherein each of the precharge high circuits further comprises an isolation circuit the effectively isolates the precharge high circuit from the signal line when the precharge high circuit is not enabled.

26. The signal accelerator system of claim 19 wherein each of the accelerate low circuits comprise:
   a sense circuit that is operable to sense when the voltage on the signal line to which the accelerate low circuit is coupled is less than the predetermined high voltage, the sense circuit being operable to generate a drive signal responsive to sensing that the voltage on the signal line is less than the predetermined high voltage; and
   a drive circuit that is responsive to the drive signal to drive the signal line to which it is coupled toward the predetermined low voltage.

27. The signal accelerator system of claim 26 wherein each of the accelerate low circuits further comprises an isolation circuit the effectively isolates the accelerate low circuit from the signal line when the accelerate low circuit is not enabled.

28. A memory bank, comprising:
   a plurality of memory arrays, each of the memory arrays comprising a plurality of memory cells arranged in rows and columns, and a sense amplifier for each column of memory cells;
   a respective I/O line extending from each of the memory arrays, the I/O lines extending through the memory bank adjacent to each other;
   a respective precharge low circuit coupled to alternate ones of the I/O lines, each of the precharge low circuits being operable to precharge the I/O line to which it is coupled to a precharge low voltage when the precharge low circuit is enabled;
   a respective precharge high circuit coupled to each of the I/O lines to which a precharge low circuit is not coupled, each of the precharge high circuits being operable to precharge the I/O line to which it is coupled to a precharge high voltage when the precharge high circuit is enabled;
   an accelerate high circuit coupled to each of the I/O lines to which a precharge low circuit is coupled, each of the accelerate high circuits being operable to drive the I/O line to which it is coupled toward the precharge high voltage responsive to detecting that the voltage of the I/O line is greater than a predetermined low voltage; and
   an accelerate low circuit coupled to each of the I/O lines to which a precharge high circuit is coupled, each of the accelerate low circuits being operable to drive the I/O line to which it is coupled toward the precharge low voltage responsive to detecting that the voltage of the I/O line is less than a predetermined high voltage.

29. The memory bank of claim 28 wherein the predetermined high voltage is substantially equal to the precharge high voltage and the predetermined low voltage is substantially equal to the precharge low voltage.

30. The memory bank of claim 29 wherein the predetermined high voltage and the precharge high voltage are substantially equal to $V_{CC}-V_T$, and the predetermined low voltage and the precharge low voltage are substantially equal to $V_T$, where $V_{CC}$ is a power supply voltage for the memory array and $V_T$ is a transistor threshold voltage.

31. The memory bank of claim 30 wherein each of the accelerate high circuits is operable to drive the I/O line to which it is coupled toward $V_{CC}$, and each of the accelerate low circuits is operable to drive the I/O line to which it is coupled toward zero volts.

32. The memory bank of claim 31 wherein each of the accelerate high circuits is operable to terminate driving the I/O line to which it is coupled toward $V_{CC}$ responsive to the signal line reaching a voltage of $V_{CC}-V_T$, and each of the accelerate low circuits is operable to terminate driving the I/O line to which it is coupled toward zero volts responsive to the I/O line reaching a voltage of $V_T$.

33. The memory bank of claim 28 wherein each of the precharge high and precharge low circuits comprise:
   a drive circuit that drives the I/O line toward the precharge voltage when the precharge circuit is enabled, the drive circuit driving the I/O line toward the precharge voltage until a drive terminate signal is generated; and
   a sense circuit that senses when the voltage on the I/O line reaches the precharge voltage, the sense circuit being operable to generate the drive terminate signal when the sense circuit senses that the voltage on the I/O line has reached the precharge voltage.

34. The memory bank of claim 33 wherein each of the precharge high and precharge low circuits further comprises an isolation circuit the effectively isolates the precharge circuit from the I/O line when the precharge circuit is not enabled.

35. The memory bank of claim 28 wherein each of the accelerate high and accelerate low circuits comprise:
   a sense circuit that is operable to sense when the voltage on the I/O line to which the accelerate circuit is coupled is greater than the predetermined low voltage in the case of the accelerate high circuit and less than the predetermined high voltage in the case of the accelerate low circuit, the sense circuit being operable to generate a drive signal responsive to sensing that the voltage on the I/O line is greater than the predetermined low voltage in the case of the accelerate high circuit and less than the predetermined high voltage in the case of the accelerate low circuit; and
   a drive circuit that is responsive to the drive signal to drive the I/O line to which it is coupled toward the precharge high voltage in the case of the accelerate high circuit and to drive the I/O line to which it is coupled toward the precharge low voltage in the case of the accelerate low circuit.

36. The memory bank of claim 35 wherein each of the accelerate high and accelerate low circuits further comprises an isolation circuit the effectively isolates the accelerate circuit from the I/O line when the accelerate circuit is not enabled.

37. The memory bank of claim 28, further comprising a control circuit operable to enable the precharge circuits when the accelerate circuits are not enabled, and to enable the accelerate circuits when the precharge circuits are not enabled.

38. A memory device, comprising:
   a command decoder receiving memory command signals through externally accessible command input terminals, the command decoder generating memory control signals responsive to predetermined combinations of the command signals;
   an address decoder receiving address signals through externally accessible address input terminals, the address decoder generating row and column addressing signals responsive to the address signals;
   a memory bank, comprising:
      a plurality of memory arrays from which data are read and to which data are written at locations corresponding the address signals responsive to the memory control signals, each of the memory arrays comprising a plurality of memory cells arranged in rows and columns, and a sense amplifier for each column of memory cells;
      a plurality of I/O lines extending from a respective memory array adjacent to each other;
      a respective precharge low circuit coupled to alternate ones of the I/O lines, each of the precharge low circuits being operable to precharge the I/O line to which it is coupled to a precharge low voltage when the precharge low circuit is enabled;
      a respective precharge high circuit coupled to each of the I/O lines to which a precharge low circuit is not coupled, each of the precharge high circuits being operable to precharge the I/O line to which it is coupled to a precharge high voltage when the precharge high circuit is enabled;
      an accelerate high circuit coupled to each of the I/O lines to which a precharge low circuit is coupled, each of the accelerate high circuits being operable to drive the I/O line to which it is coupled toward the precharge high voltage responsive to detecting that the voltage of the I/O line is greater than a predetermined low voltage; and
      an accelerate low circuit coupled to each of the I/O lines to which a precharge high circuit is coupled, each of the accelerate low circuits being operable to drive the I/O line to which it is coupled toward the precharge low voltage responsive to detecting that the voltage of the I/O line is less than a predetermined high voltage; and
   a data path extending between a plurality of externally accessible data bus terminals and the I/O lines for coupling data signals to and from the memory arrays.

39. The memory device of claim 38 wherein the predetermined high voltage is substantially equal to the precharge high voltage and the predetermined low voltage is substantially equal to the precharge low voltage.

40. The memory device of claim 39 wherein the predetermined high voltage and the precharge high voltage are substantially equal to $V_{CC}-V_T$, and the predetermined low voltage and the precharge low voltage are substantially equal to $V_T$, where $V_{CC}$ is a power supply voltage for the memory array and $V_T$ is a transistor threshold voltage.

41. The memory device of claim 40 wherein each of the accelerate high circuits is operable to drive the I/O line to which it is coupled toward $V_{CC}$, and each of the accelerate low circuits is operable to drive the I/O line to which it is coupled toward zero volts.

42. The memory device of claim 41 wherein each of the accelerate high circuits is operable to terminate driving the I/O line to which it is coupled toward $V_{CC}$ responsive to the signal line reaching a voltage of $V_{CC}-V_T$, and each of the accelerate low circuits is operable to terminate driving the I/O line to which it is coupled toward zero volts responsive to the I/O line reaching a voltage of $V_T$.

43. The memory device of claim 38 wherein each of the precharge high and precharge low circuits comprise:
   a drive circuit that drives the I/O line toward the precharge voltage when the precharge circuit is enabled, the drive circuit driving the I/O line toward the precharge voltage until a drive terminate signal is generated; and
   a sense circuit that senses when the voltage on the I/O line reaches the precharge voltage, the sense circuit being operable to generate the drive terminate signal when the sense circuit senses that the voltage on the I/O line has reached the precharge voltage.

44. The memory device of claim 43 wherein each of the precharge high and precharge low circuits further comprises an isolation circuit the effectively isolates the precharge circuit from the I/O line when the precharge circuit is not enabled.

45. The memory device of claim 38 wherein each of the accelerate high and accelerate low circuits comprise:
   a sense circuit that is operable to sense when the voltage on the I/O line to which the accelerate circuit is coupled is greater than the predetermined low voltage in the case of the accelerate high circuit and less than the predetermined high voltage in the case of the accelerate low circuit, the sense circuit being operable to generate a drive signal responsive to sensing that the voltage on the I/O line is greater than the predetermined low voltage in the case of the accelerate high circuit and less than the predetermined high voltage in the case of the accelerate low circuit; and
   a drive circuit that is responsive to the drive signal to drive the I/O line to which it is coupled toward the precharge high voltage in the case of the accelerate high circuit and to drive the I/O line to which it is coupled toward the precharge low voltage in the case of the accelerate low circuit.

46. The memory device of claim 45 wherein each of the accelerate high and accelerate low circuits further comprises an isolation circuit the effectively isolates the accelerate circuit from the I/O line when the accelerate circuit is not enabled.

47. The memory device of claim 38, further comprising a control circuit operable to enable the precharge circuits when the accelerate circuits are not enabled, and to enable the accelerate circuits when the precharge circuits are not enabled.

48. The memory device of claim 38 wherein the memory device comprises a dynamic random access memory.

49. A computer system, comprising:
an integrated circuit processor having a plurality of externally accessible terminals coupled to a processor bus;
an input device coupled to the processor through the processor bus adapted to allow data to be entered into the computer system;
an output device coupled to the processor through the processor bus adapted to allow data to be output from the computer system; and
a dynamic random access memory coupled to a processor bus, the dynamic random access memory comprising:
a command decoder receiving memory command signals through externally accessible command input terminals, the command decoder generating memory control signals responsive to predetermined combinations of the command signals;
an address decoder receiving address signals through externally accessible address input terminals, the address decoder generating row and column addressing signals responsive to the address signals;
a memory bank comprising:
a plurality of memory arrays from which data are read and to which data are written at locations corresponding the address signals responsive to the memory control signals, each of the memory arrays comprising a plurality of memory cells arranged in rows and columns, and a sense amplifier for each column of memory cells;
a plurality of I/O lines extending from a respective memory array adjacent to each other;
a respective precharge low circuit coupled to alternate ones of the I/O lines, each of the precharge low circuits being operable to precharge the I/O line to which it is coupled to a precharge low voltage when the precharge low circuit is enabled;
a respective precharge high circuit coupled to each of the I/O lines to which a precharge low circuit is not coupled, each of the precharge high circuits being operable to precharge the I/O line to which it is coupled to a precharge high voltage when the precharge high circuit is enabled;
an accelerate high circuit coupled to each of the I/O lines to which a precharge low circuit is coupled, each of the accelerate high circuits being operable to drive the I/O line to which it is coupled toward the precharge high voltage responsive to detecting that the voltage of the I/O line is greater than a predetermined low voltage; and
an accelerate low circuit coupled to each of the I/O lines to which a precharge high circuit is coupled, each of the accelerate low circuits being operable to drive the I/O line to which it is coupled toward the precharge low voltage responsive to detecting that the voltage of the I/O line is less than a predetermined high voltage; and
a data path extending between a plurality of externally accessible data bus terminals and the I/O lines for coupling data signals to and from the memory array.

50. The computer system of claim 49 wherein the predetermined high voltage is substantially equal to the precharge high voltage and the predetermined low voltage is substantially equal to the precharge low voltage.

51. The computer system of claim 50 wherein the predetermined high voltage and the precharge high voltage are substantially equal to $V_{CC}-V_T$, and the predetermined low voltage and the precharge low voltage are substantially equal to $V_T$, where $V_{CC}$ is a power supply voltage for the memory array and $V_T$ is a transistor threshold voltage.

52. The computer system of claim 51 wherein each of the accelerate high circuits is operable to drive the I/O line to which it is coupled toward $V_{CC}$, and each of the accelerate low circuits is operable to drive the I/O line to which it is coupled toward zero volts.

53. The computer system of claim 52 wherein each of the accelerate high circuits is operable to terminate driving the I/O line to which it is coupled toward $V_{CC}$ responsive to the signal line reaching a voltage of $V_{CC}-V_T$, and each of the accelerate low circuits is operable to terminate driving the I/O line to which it is coupled toward zero volts responsive to the I/O line reaching a voltage of $V_T$.

54. The computer system of claim 49 wherein each of the precharge high and precharge low circuits comprise:
a drive circuit that drives the I/O line toward the precharge voltage when the precharge circuit is enabled, the drive circuit driving the I/O line toward the precharge voltage until a drive terminate signal is generated; and
a sense circuit that senses when the voltage on the I/O line reaches the precharge voltage, the sense circuit being operable to generate the drive terminate signal when the sense circuit senses that the voltage on the I/O line has reached the precharge voltage.

55. The computer system of claim 54 wherein each of the precharge high and precharge low circuits further comprises an isolation circuit the effectively isolates the precharge circuit from the I/O line when the precharge circuit is not enabled.

56. The computer system of claim 49 wherein each of the accelerate high and accelerate low circuits comprise:
a sense circuit that is operable to sense when the voltage on the I/O line to which the accelerate circuit is coupled is greater than the predetermined low voltage in the case of the accelerate high circuit and less than the predetermined high voltage in the case of the accelerate low circuit, the sense circuit being operable to generate a drive signal responsive to sensing that the voltage on the I/O line is greater than the predetermined low voltage in the case of the accelerate high circuit and less than the predetermined high voltage in the case of the accelerate low circuit; and
a drive circuit that is responsive to the drive signal to drive the I/O line to which it is coupled toward the precharge high voltage in the case of the accelerate high circuit and to drive the I/O line to which it is coupled toward the precharge low voltage in the case of the accelerate low circuit.

57. The computer system of claim 56 wherein each of the accelerate high and accelerate low circuits further comprises an isolation circuit the effectively isolates the accelerate circuit from the I/O line when the accelerate circuit is not enabled.

58. The computer system of claim 49, further comprising a control circuit operable to enable the precharge circuits when the accelerate circuits are not enabled, and to enable the accelerate circuits when the precharge circuits are not enabled.

59. A method of accelerating the coupling of a digital signal through a signal line, comprising:

precharging the signal line to a first voltage;

after precharging the signal line to the first voltage, applying the digital signal to the signal line at a first location;

detecting whether the voltage of the signal line has changed from the first voltage at a second location of the signal line that is spaced from the first location;

in response to detecting that the voltage of the signal line has changed, driving the signal line toward a voltage that increases the voltage change.

60. The method of claim 59 wherein the act of precharging the signal line to a first voltage comprises precharging the signal line to $V_T$, where $V_T$ is the threshold voltage of a transistor.

61. The method of claim 60 wherein the act of detecting whether the voltage of the signal line has changed from the first voltage comprises detecting whether the voltage of the signal line has increased above $V_T$.

62. The method of claim 61 wherein the act of driving the signal line toward a voltage that increases the voltage change comprises driving the signal line toward $V_{CC}$, where $V_{CC}$ is a supply voltage.

63. The method of claim 59 wherein the act of precharging the signal line to a first voltage comprises precharging the signal line to $V_{CC}-V_T$, where $V_{CC}$ is a power supply voltage and $V_T$ is the threshold voltage of a transistor.

64. The method of claim 63 wherein the act of detecting whether the voltage of the signal line has changed from the first voltage comprises detecting whether the voltage of the signal line has decreased below $V_{CC}-V_T$.

65. The method of claim 64 wherein the act of driving the signal line toward a voltage that increases the voltage change comprises driving the signal line toward zero volts.

66. In a memory bank in which a plurality of I/O lines extend from respective arrays through the memory bank adjacent to each other, a method of accelerating the coupling of write data signals to the memory arrays and read data signals from the memory arrays, the method comprising:

precharging a first set of alternating I/O lines to a first voltage;

precharging to a second voltage a second set of the I/O lines that are not precharged to the first voltage, the second voltage having a larger magnitude than the first voltage;

after precharging the I/O lines in the first set to the first voltage, detecting whether the voltage of any of the I/O lines in the first set has increased from the first voltage;

after precharging the I/O lines in the second set to the second voltage, detecting whether the voltage of any of the I/O lines in the second set has decreased from the second voltage;

in response to detecting that the voltage of any of the I/O lines in the first set has increased above the first voltage, driving the I/O line toward a third voltage that is larger than the first voltage; and in response to detecting that the voltage of any of the I/O lines in the second set has decreased below the second voltage, driving the I/O line toward a fourth voltage that is larger than the second voltage.

67. The method of claim 66 wherein the first voltage comprises $V_T$, where $V_T$ is a threshold voltage of a transistor in the memory array, and wherein the second voltage comprises $V_{CC}-V_T$, where $V_{CC}$ is a voltage supplying power to the memory array.

68. The method of claim 67 wherein the third voltage comprises $V_{CC}$ and the fourth voltage comprises zero volts.

69. The method of clam 66, further comprising:

terminating the act of driving the I/O line in the first set toward the third voltage when the voltage of the I/O line has increased to the second voltage; and terminating the act of driving the I/O line in the second set toward the fourth voltage when the voltage of the I/O line has decreased to the first voltage.

70. The method of claim 69 wherein the first voltage comprises $V_T$, where $V_T$ is the threshold voltage of a transistor in the memory array, the second voltage comprises $V_{CC}-V_T$, where $V_{CC}$ is a voltage supplying power to the memory array, the third voltage comprises $V_{CC}$, and the fourth voltage comprises zero volts.

* * * * *